US009865844B1

(12) United States Patent
Park et al.

(10) Patent No.: US 9,865,844 B1
(45) Date of Patent: Jan. 9, 2018

(54) DISPLAY DEVICE

(71) Applicant: Samsung Display Co., Ltd., Yongin-si (KR)

(72) Inventors: Young Sang Park, Seoul (KR); Ah Young Kim, Gunpo-si (KR); Chul Ho Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/480,620

(22) Filed: Apr. 6, 2017

(30) Foreign Application Priority Data

Jun. 28, 2016 (KR) .................. 10-2016-0080937

(51) Int. Cl.
*H01L 27/32* (2006.01)
*H01L 51/52* (2006.01)
*H01L 51/00* (2006.01)
*H01L 51/56* (2006.01)

(52) U.S. Cl.
CPC ........ *H01L 51/5281* (2013.01); *H01L 27/322* (2013.01); *H01L 51/0097* (2013.01); *H01L 51/524* (2013.01); *H01L 51/5253* (2013.01); *H01L 51/5284* (2013.01); *H01L 51/56* (2013.01); *H01L 2251/5338* (2013.01); *H01L 2251/558* (2013.01)

(58) Field of Classification Search
CPC ............. H01L 23/4952; H01L 23/3121; H01L 23/49575; H01L 23/544; H01L 24/09; H01L 24/32; H01L 24/49; H01L 27/3272; H01L 27/3244
See application file for complete search history.

(56) References Cited

U.S. PATENT DOCUMENTS

| 2013/0083496 | A1 | 4/2013 | Franklin et al. |
| 2014/0065326 | A1 | 3/2014 | Lee et al. |
| 2014/0138643 | A1* | 5/2014 | Choi ............... H01L 27/3267 257/40 |
| 2016/0152875 | A1* | 6/2016 | No ................ H01L 27/3244 359/893 |
| 2016/0315123 | A1* | 10/2016 | Kim ................ H01L 27/3272 |
| 2017/0084673 | A1* | 3/2017 | Lee ................ H01L 27/3244 |

FOREIGN PATENT DOCUMENTS

| KR | 10-2014-0033546 | 3/2014 |
| KR | 10-1461611 | 11/2014 |
| KR | 10-2015-0050715 | 5/2015 |
| KR | 10-2016-0028174 | 3/2016 |

* cited by examiner

*Primary Examiner* — Cuong Q Nguyen
(74) *Attorney, Agent, or Firm* — H.C. Park & Associates, PLC

(57) ABSTRACT

A display device includes a display panel and a cover window disposed on the display panel. The cover window includes a first window member and a second window member. The first window member includes an impact absorption layer. The second window member includes an optical compensation layer and a film layer disposed on the optical compensation layer. The second window member further includes a coating portion disposed on the film layer or a third functional coating layer disposed on the film layer. The first window member is disposed between the display panel and the second window member, or the second window member is disposed between the display panel and the first window member.

24 Claims, 9 Drawing Sheets

DISPLAY DEVICE

CROSS-REFERENCE TO RELATED APPLICATION

This application claims priority from and the benefit of Korean Patent Application No. 10-2016-0080937, filed on Jun. 28, 2016, which is hereby incorporated by reference for all purposes as if fully set forth herein.

BACKGROUND

Field

One or more exemplary embodiments relate to a display device.

Discussion

A conventional display device typically includes a display panel that includes a plurality of pixels to display an image, and a transparent cover window that covers a display side of the display panel. The cover window may function to protect a touch screen panel and the display panel from external impact and/or damage, such as scratches, scuffs, etc. A conventional foldable display can be folded and unfolded, whereas a conventional flexible display device may be rolled and unrolled (or otherwise contorted and uncontorted). A need, therefore, exists for a cover window that is capable of protecting a deformable display device, but is also sufficiently flexible enough to be bendable while maintaining its strength.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a display device that includes a cover window with improved bending characteristics and resistance against external impacts and damage to components of the display device.

Additional aspects will be set forth in the detailed description which follows, and, in part, will be apparent from the disclosure, or may be learned by practice of the inventive concepts.

According to one or more exemplary embodiments, a display device includes a display panel and a cover window disposed on the display panel. The cover window includes a first window member and a second window member. The first window member is disposed on the display panel. The first window member includes an impact absorption layer. The second window member is disposed on the first window member, the first window member being disposed between the display panel and the second window member. The second window member includes an optical compensation layer, a film layer disposed on the optical compensation layer, and a coating portion disposed on the film layer.

According to one or more exemplary embodiments, a display device includes a display panel and a cover window disposed on the display panel. The cover window includes a first window member and a second window member. The second window member is disposed on the display panel. The first window member is disposed on the second window member, the second window member being disposed between the first window member and the display panel. The first window member includes an impact absorption layer. The second window member includes an optical compensation layer, a film layer disposed on the optical compensation layer, and a third functional coating layer disposed on the film layer.

According to one or more exemplary embodiments, a first window member and a second window member are provided to improve impact resistance characteristics and bending characteristics of a cover window of a display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
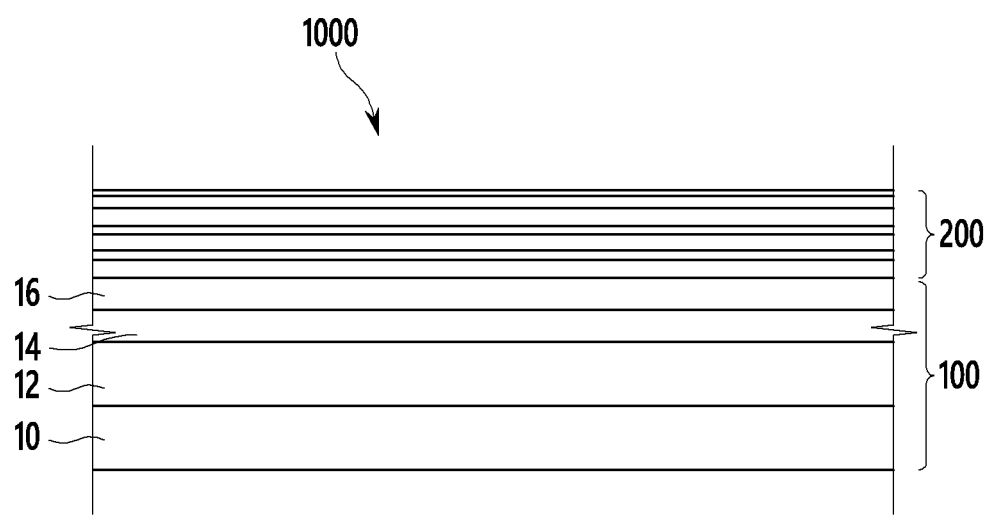
FIG. 1 is a schematic cross-sectional view of a display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. To this end, various exemplary embodiments may be different, but do not have to be exclusive. For example, specific shapes, configurations, and characteristics of an exemplary embodiment may be implemented in another exemplary embodiment without departing from the spirit and the scope of the present disclosure.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
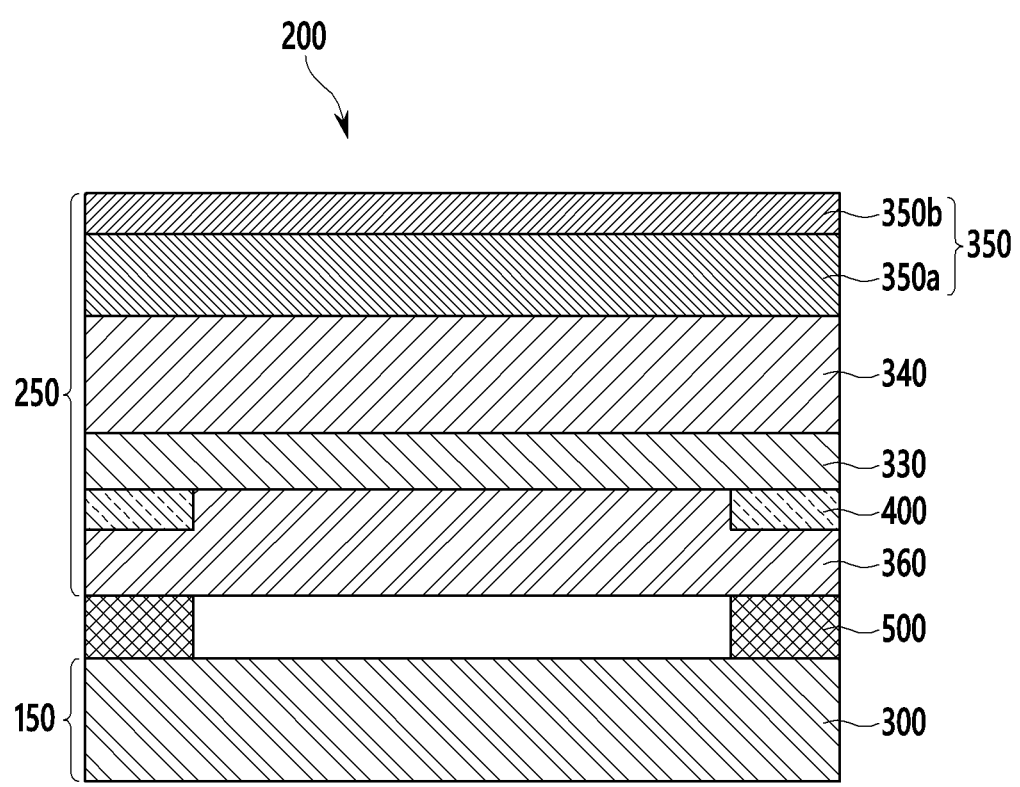
FIG. 2 is a schematic cross-sectional view of a cover window of the display device of FIG. 1, according to one or more exemplary embodiments.

FIG. 1 is a schematic cross-sectional view of a display device, according to one or more exemplary embodiments. FIG. 2 is a schematic cross-sectional view of a cover window of the display device of FIG. 1, according to one or more exemplary embodiments.

Referring to FIGS. 1 and 2, a display device 1000 according to one or more exemplary embodiments includes a display panel 100 and a cover window 200. The cover window 200 includes a first window member (or structure) 150 and a second window member (or structure) 250. Although specific reference will be made to this particular implementation, it also contemplated that the display device 1000 and/or cover window 200 may embody many forms and include multiple and/or alternative components.

The display panel 100 substantially generates an image to be displayed by the display device 1000. Depending on a structure and a mechanism of light generation for displaying an image, the display panel 100 according to one or more exemplary embodiments may be at least one of various display panels, such as a liquid crystal display panel, a plasma display panel, an organic light emitting display panel, and the like. Exemplary embodiments, however, are not limited thereto or thereby. In this manner, various other display panels may be utilized in association with one or more exemplary embodiments.

The display panel 100 may include, for example, a substrate 10, a display element layer 12 that is provided on the substrate 10, a thin film encapsulation layer 14, and a functional layer 16. The thin film encapsulation layer 14 and the functional layer 16 are provided above the display element layer 12, e.g., between the display element layer 12 and the cover window 200.

The substrate 10 is a transparent substrate and may be made of a flexible material, such as a polymer film. The display element layer 12 is provided on the substrate 10, and includes an element area where an active element, such as a thin film transistor (TFT), is provided and an emission area where an emission layer is provided. The element area and the emission area may be separate from each other or may overlap each other.

The thin film encapsulation layer 14 protects the display substrate 10 and the display element layer 12 by covering (e.g., hermetically sealing) the display substrate 10 and the display element layer 12. The functional layer 16 is provided on the thin film encapsulation layer 14 and may be additionally disposed on the display element layer 12. The thin film encapsulation layer 14 prevents (or reduces) infiltration of oxygen and moisture from the outside to, thereby, protect the display element layer 12.

The functional layer 16 may be provided as a phase delay film and/or a polarizer; however, any other suitable functional layer(s) may be utilized. A phase delay film may be a quarter wavelength (or λ/4) phase delay film, and may circularly polarize linearly polarized light or linearly polarize circularly polarized light. A polarizer may reduce a thickness and provide a flexibility characteristic.

The cover window 200 is disposed on the display panel 100.

Referring to FIG. 2, the cover window 200 according to one or more exemplary embodiments may include the first window member 150 that is disposed (for instance attached, coupled, formed, and/or the like) on the display panel 100 and the second window member 250 that is disposed on the first window member 150.

The first window member 150 protects the cover window 200 from an external impact, and, at the same time, provides sufficient bending characteristics to the cover window 200. For instance, the first window member 150 may include an impact absorption layer 300. It is noted that, as shown in FIG. 2, the impact absorption layer 300 may be provided as a single layer. That is, the first window member 150 may be the impact absorption layer 300. It is contemplated, however, that the first window member 150 may include the impact absorption layer 300, which may be formed as a multilayer structure.

According to one or more exemplary embodiments, the impact absorption layer 300 is formed of thin glass with a Young's modulus greater than or equal to 40 GPa and less than or equal to 60 GPa, e.g., greater than or equal to 45 GPa and less than or equal to 55 GPa, such as greater than or equal to 40 GPa and less than or equal to 50 GPa, for instance, greater than or equal to 50 GPa and less than or equal to 60 GPa. When the impact absorption layer 300 is provided as thin glass with a Young's modulus satisfying at least one of the aforementioned ranges, the impact absorption layer 300 can absorb external impacts so that the display panel 100 disposed below the cover window 200 can be sufficiently and effectively protected.

A thickness of the impact absorption layer 300 may be greater than or equal to about 50 μm and less than or equal to about 100 μm, e.g., greater than or equal to about 65 μm and less than or equal to about 85 μm, such as greater than or equal to about 50 μm and less than or equal to about 85 μm, for instance, greater than or equal to about 65 μm and less than or equal to about 100 μm. As described, when the impact absorption layer 300 is provided as single-layered thin glass, the entire thickness of the cover window 200 can be reduced.

The second window member 250 protects the cover window 200 from damage, such as dents, scratches, scuffs, and/or the like, and may include an optical compensation layer 330, a film layer 340 that is provided on the optical compensation layer 330, and a coating portion 350 that is provided on the film layer 340.

The optical compensation layer 330 is a functional layer provided for enhancement of visibility of the display device 1000, and may serve to compensate for a color of the film layer 340. The optical compensation layer 330 may be, for example, a coating layer that is formed using a composition that includes an organosilicon compound (e.g., silsesquioxane, etc.) or a composition that includes an organosilicon compound and a filler (e.g., silsesquioxane and a filler). Exemplary embodiments, however, are not limited thereto or thereby.

The film layer 340 is provided on the optical compensation layer 330, e.g., the optical compensation layer is disposed between the film layer 340 and the first window member 150. The film layer 340 may be a film having relatively excellent transparency, mechanical strength, thermal stability, a moisture-shielding property, and an isotropic property may be used, but the film layer 340 is not limited to or by a specific film. The film layer 340 may be made of (or include at least one of), for example, polyethylene naphthalate (PEN), polymethyl methacrylate (PMMA), polyurethane (PU), polyethylene terephthalate (PET), polyimide (PI), and polycarbonate (PC). A thickness of the film layer 340 may be greater than or equal to about 20 μm and less than or equal to about 100 μm, e.g., greater than or equal to about 40 μm and less than or equal to about 80 μm, e.g., greater than or equal to about 20 μm and less than or equal to about 80 μm, e.g., greater than or equal to about 40 μm and less than or equal to about 100 μm.

The coating portion 350 is provided on the film layer 340, e.g., the film layer 340 is disposed between the coating portion 350 and the first window member 150. In one or more exemplary embodiments, the coating portion 350 may include a first functional coating layer 350a and a second functional coating layer 350b that is disposed on the first functional coating layer 350a, e.g., the first function coating layer 350a may be disposed between the second functional coating layer 350b and the first window member 150.

The first functional coating layer 350a is a hard coating layer coated on the film layer 340 and increases hardness of the cover window 200. That is, the hardness of the first functional coating layer 350a may be greater than or equal to about 3 H and less than or equal to about 6 H, e.g., greater than or equal to about 4 H and less than or equal to about 5 H, such as greater than or equal to about 4 H and less than or equal to about 6 H, for instance, greater than or equal to about 3 H and less than or equal to about 5 H. For the purposes of this disclosure, the hardness implies a value measured using a pencil hardness measurer (or tester) with reference to 1000 g. In addition, the first functional coating layer 350a may be formed by, for example, mixing nanoparticles in an acryl-based resin, a silicon-based resin, or an acryl-based resin. The nanoparticles may be made of silica.

The second functional coating layer 350b is an anti-fingerprint layer, and is formed by performing a water repellent coating or an oil repellent coating on the first functional coating layer 350a. The second functional coating layer 350b decreases surface energy of the cover window 200. The second functional coating layer may be made of, for example, a fluorinated or silicon-based material.

A first light blocking layer 500 may be provided between the first window member 150 and the second window member 250. That is, the first light blocking layer 500 is disposed between the first window member 150 and the second window member 250, and may be provided in at least one edge of sides at which the first window member 150 and the second window member 250 face each other. The edge(s) of the first window member 150 and/or the second window member 250, in which the first light blocking layer 500 is located, is a light blocking area where external light is blocked in (or by) the cover window 200.

Market demands for new designs for display devices have given rise to the formation of various colors of light in a light blocking area of a cover window. As such, the first light blocking layer 500 that is disposed in at least one of a plurality of edges between sides at which the first window member 150 and the second window member 250 face each other is included, and, therefore, a thickness of the light blocking layer 500 can be freely adjusted depending on a desired color. In this manner, various colors can be realized, and, as such, an exterior characteristic of the cover window 200 can be improved. It is also noted that the first light blocking layer 500 can be formed using colorless or colored ink. A thickness of the first light blocking layer 500 may be greater than or equal to about 5 μm and less than or equal to about 40 μm, but exemplary embodiments are not limited thereto or thereby.

According to one or more exemplary embodiments, the cover window 200 may include a second light blocking layer 400 that is provided in a lower edge of the optical compensation layer 330. For instance, the second light blocking layer 400 may be disposed between the optical compensation layer 330 and the first window member 150. The second light blocking layer 400 blocks light incident on the cover window 200 to prevent (or at least reduce) wires in a bezel area of the display panel 100, to which the cover window 200 is applied, from being viewed from the outside. In this manner, the second light blocking layer 400 may be provided as, for example, colorless (e.g., black) ink. A thickness of the second light blocking layer 400 is not restrictive, and the thickness may be, for example, 10 μm or less. For instance, the thickness of the second light blocking layer 400 may be 1 μm to 10 μm or 2 μm to 8 μm.

In one or more exemplary embodiments, the first light blocking layer 500 and the second light blocking layer 400 may be disposed to correspond to each other. For instance, the second light blocking layer 400 may overlap the first light blocking layer 500.

According to one or more exemplary embodiments, the first window member 150 and the second window member 250 may be bonded to each other via an adhesive layer 360 that is disposed below the second window member 250. In this case, as shown in FIG. 2, the adhesive layer 360 may cover the second light blocking layer 400 and a surface of the optical compensation layer 330 facing the second light blocking layer 400.

Figure 3:
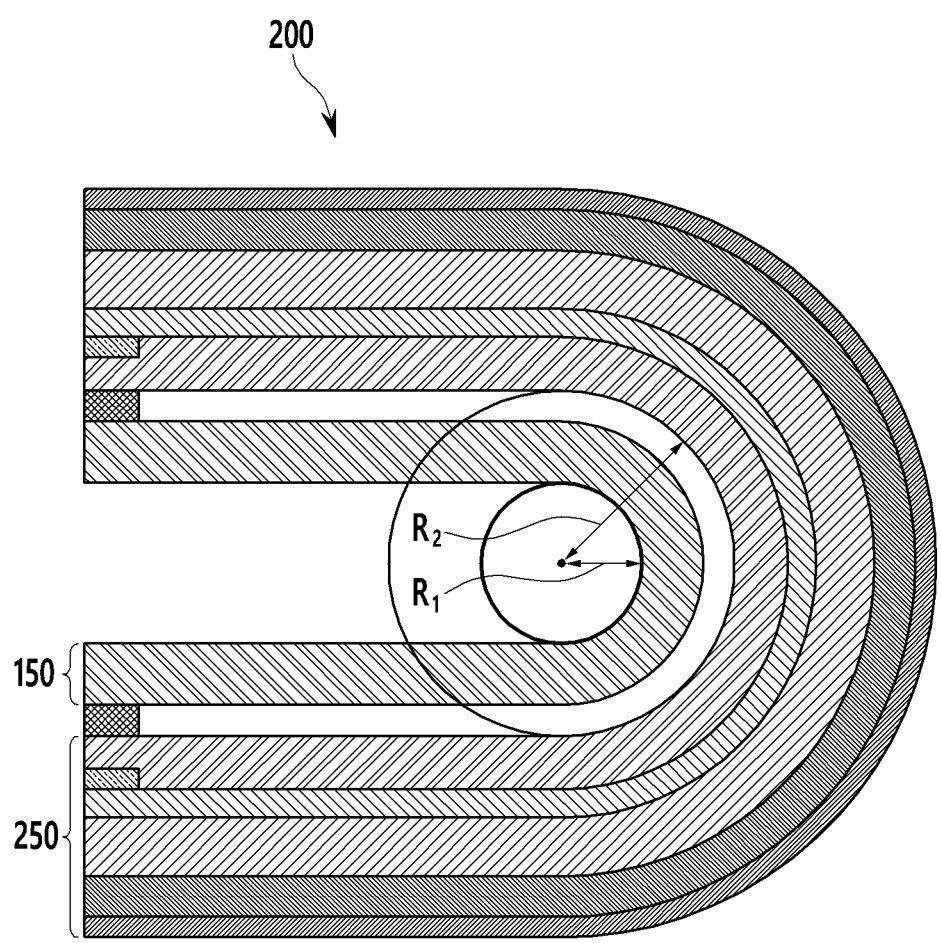
FIG. 3 is a schematic cross-sectional view of the cover window of FIG. 2 in a bent state, according to one or more exemplary embodiments.

FIG. 3 is a schematic cross-sectional view of the cover window of FIG. 2 in a bent state, according to one or more exemplary embodiments.

As seen in FIG. 3, the display device 1000 may be bent such that the first window member 150 is disposed at an inner side and the second window member 250 is disposed at an outer side. In this manner, a radius of curvature $R_1$ of the first window member 150 is smaller than a radius of curvature $R_2$ of the second window member 250. As such, cover window 200 includes the first window member 150 attached on the display panel 100 and the second window member 250 attached on the first window member 150.

Figure 4:
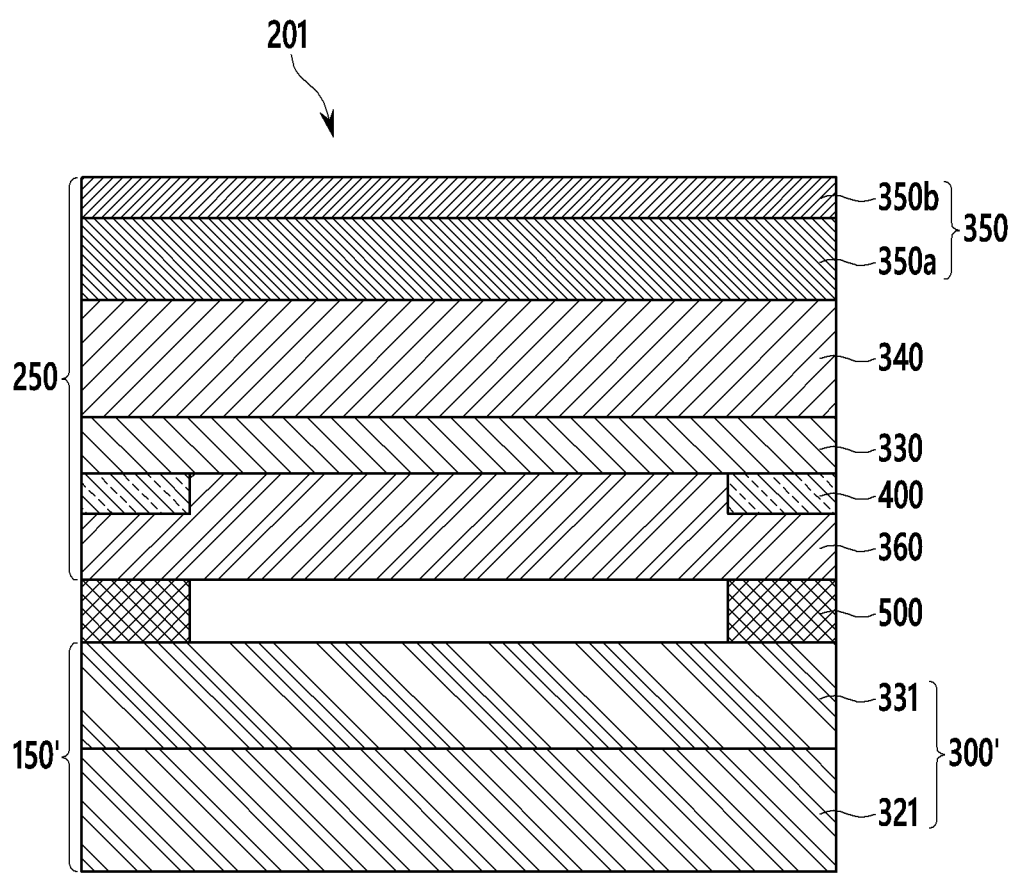
FIGS. 4 and 5 are cross-sectional views of cover windows, according to one or more exemplary embodiments.

FIG. 4 is a cross-sectional view of a cover window, according to one or more exemplary embodiments. The cover window 201 of FIG. 4 may be formed on (or coupled to) the display panel 100 of FIG. 1 in a similar manner as the cover window 200 of FIGS. 1 to 3. To this end, the cover window 201 may be similar to the cover window 200 of FIGS. 1 to 3, and, as such, detailed descriptions of the same (or similar) components as those previously described with cover window 200 will be primarily omitted to avoid obscuring exemplary embodiments.

Referring to FIG. 4, a first window member 150' may have an impact absorption structure 300' that includes, for example, an impact absorption layer 321 and an impact absorption coating layer 331.

The impact absorption layer 321 is made of a thermoplastic resin with a Young's modulus greater than or equal to 10 MPa and less than or equal to 200 MPa, e.g., greater than or equal to 60 MPa and less than or equal to 150 MPa, such as greater than or equal to 10 MPa and less than or equal to 100 MPa, for instance, greater than or equal to 110 MPa and less than or equal to 200 MPa. Yield stress of the impact absorption layer 321 may be greater than or equal to 10 MPa and less than or equal to 100 MPa, e.g., greater than or equal to 30 MPa and less than or equal to 80 MPa, such as greater than or equal to 10 MPa and less than or equal to 80 MPa, for instance, greater than or equal to 30 MPa and less than or equal to 100 MPa. Fracture elongation of the impact absorption layer 321 may be 100% to 700%. When the Young's modulus, the yield stress, and/or the fracture elongation of the impact absorption layer 321 respectively satisfy the aforementioned ranges, external impacts can be sufficiently dispersed. In this manner, an impact buffering function of the first window member 150' can be more effectively realized.

According to one or more exemplary embodiments, the Young's modulus and the yield stress imply values measured using, for example, the American Society for Testing and Materials (ASTM) standard test method ASTM D638 or ASTM D3039. In addition, the fracture elongation implies a degree of elongation before fracture in a tensile test.

A thickness of the impact absorption layer 321 may be greater than or equal to 100 μm and less than or equal to 400 μm, such as greater than or equal to 100 μm and less than or equal to 200 μm, e.g., greater than or equal to 125 μm and less than or equal to 175 μm, for instance, greater than or equal to 100 μm and less than or equal to 150 μm, for example, greater than or equal to 150 μm and less than or equal to 200 μm. When the thickness of the impact absorption layer 321 satisfies at least one of the aforementioned ranges, the cover window 201 can provide sufficient impact resistance without increasing the thickness of the cover window 201. It is noted that the impact absorption layer 321 may be made of, for example, a thermoplastic polyurethane-based resin.

The impact absorption coating layer 331 may be provided on the impact absorption layer 321, e.g., the impact absorption coating layer 331 may be disposed between the impact absorption layer 321 and the second window member 250. In one or more exemplary embodiments, the impact absorption coating layer 331 is a layer having a self-healing capability, and no additional coating or repairing process needs to be performed when a surface of the impact absorption coating layer 331 is damaged. In this manner, the impact absorption coating layer 331 can maintain its external appearance and protective performance.

For example, the impact absorption coating layer 331 may include a molecular structure that can have high elasticity or elastic restoring force. As such, the impact absorption coating layer 331 exerts a self-restoration effect by dispersing (or distributing) external force that otherwise causes scratches or external damage, thereby providing a relatively high self-healing characteristic. The molecular structure capable of having such high elasticity or elastic restoring force includes, for example, a net network structure formed by crosslinking.

Young's modulus of the impact absorption coating layer 331 may be greater than or equal to 20 MPa and less than or equal to 50 MPa, e.g., greater than or equal to 30 MPa and less than or equal to 40 MPa, such as greater than or equal to 20 MPa and less than or equal to 40 MPa, for instance, greater than or equal to 30 MPa and less than or equal to 50 MPa. In addition, the impact absorption coating layer 331 may have yield stress of greater than or equal to 5 MPa and less than or equal to 20 MPa, e.g., greater than or equal to 10 MPa and less than or equal to 15 MPa, such as greater than or equal to 10 MPa and less than or equal to 20 MPa, for instance, greater than or equal to 5 MPa and less than or equal to 15 MPa. Fracture elongation of the impact absorption coating layer 331 may be 100% to 450%. When the Young's modulus, yield stress, and/or fracture elongation of the impact absorption coating layer 331 satisfy at least one of the aforementioned ranges, the function of the first window member 150, e.g., dispersion of external impacts, can be more effectively realized.

A thickness of the impact absorption coating layer 331 may be greater than or equal to 5 µm and less than or equal to 20 µm, e.g., greater than or equal to 10 µm and less than or equal to 15 µm, such as greater than or equal to 5 µm and less than or equal to 15 µm, for instance, greater than or equal to 10 µm and less than or equal to 20 µm. When the thickness of the impact absorption coating layer 331 satisfies at least one of the aforementioned ranges, impact resistance can be realized without increasing the thickness of the cover window 201.

Figure 5:
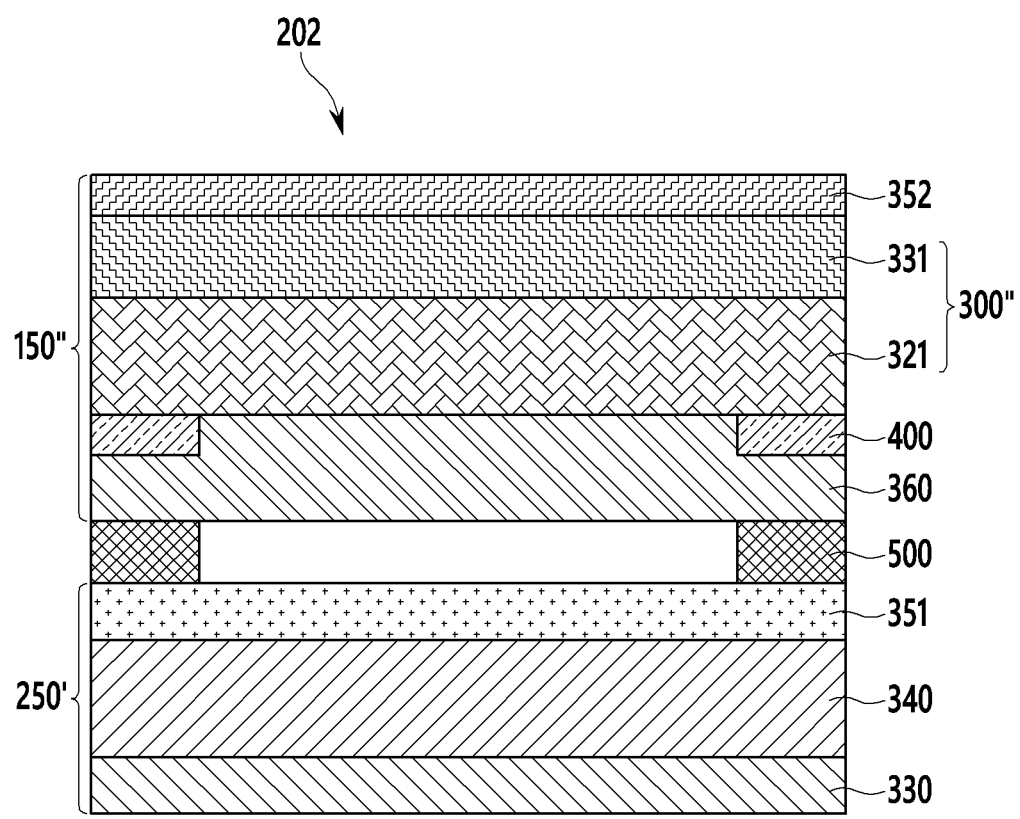

FIG. 5 is a cross-sectional view of a cover window, according to one or more exemplary embodiments. The cover window 202 of FIG. 5 may be formed on (or coupled to) the display panel 100 of FIG. 1 in a similar manner as the cover window 200 of FIGS. 1 to 3. To this end, the cover window 202 may be similar to the cover windows 200 and 201 of FIGS. 1 to 4, and, as such, detailed descriptions of the same (or similar) components as those previously described will be primarily omitted to avoid obscuring exemplary embodiments.

Referring to FIG. 5, the cover window 202 includes a first window member 150" disposed on a second window member 250'. That is, when the cover window 202 is employed as the cover window 200 disposed on the display panel 100 in the display device 1000 of FIG. 1, the second window member 250' is attached on the display panel 100 and the first window member 150" is attached on the second window member 250'. As such, when the cover window 202 is in a bent state (see FIG. 6), a radius of curvature of the second window member 250' is smaller than a radius of curvature of the first window member 150".

The first window member 150" may include a second light blocking layer 400 disposed at a lower edge of an impact absorption structure 300'. For instance, the second light blocking layer 400 may be disposed between the impact absorption layer 321 and the second window member 250'. The second light blocking layer 400 has a function and features that are the same as those previously described in association with FIG. 2.

According to one or more exemplary embodiments, the first window member 150" and the second window member 250' may be attached to each other by an adhesive layer 360 that is disposed below the first window member 150. As shown in FIG. 5, the adhesive layer 360 may cover the second light blocking layer 400 and a surface of the impact absorption layer 321 facing the second light blocking layer 400.

A third functional coating layer 351 may be provided on a film layer 340 of the second window member 250. For instance, the third functional coating layer 351 may be disposed between the first window member 150" and the film layer 340. The third functional coating layer 351 has the same function and features as the first functional coating layer 350a previously described in association with FIG. 2, and, as such, no further detailed description of the third function coating layer 351 will be provided.

A fourth functional coating layer 352 may be provided on the impact absorption layer 300 of the first window member 150". For instance, the impact absorption coating layer 331 may be disposed between the fourth functional coating layer 352 and the second window member 250'. The fourth functional coating layer 352 is an anti-fingerprint layer with the same function and features as previously described in association with the second functional coating layer 350b of FIG. 2, and, therefore, no further detailed description of the fourth functional coating layer 352 will be provided.

Figure 6:
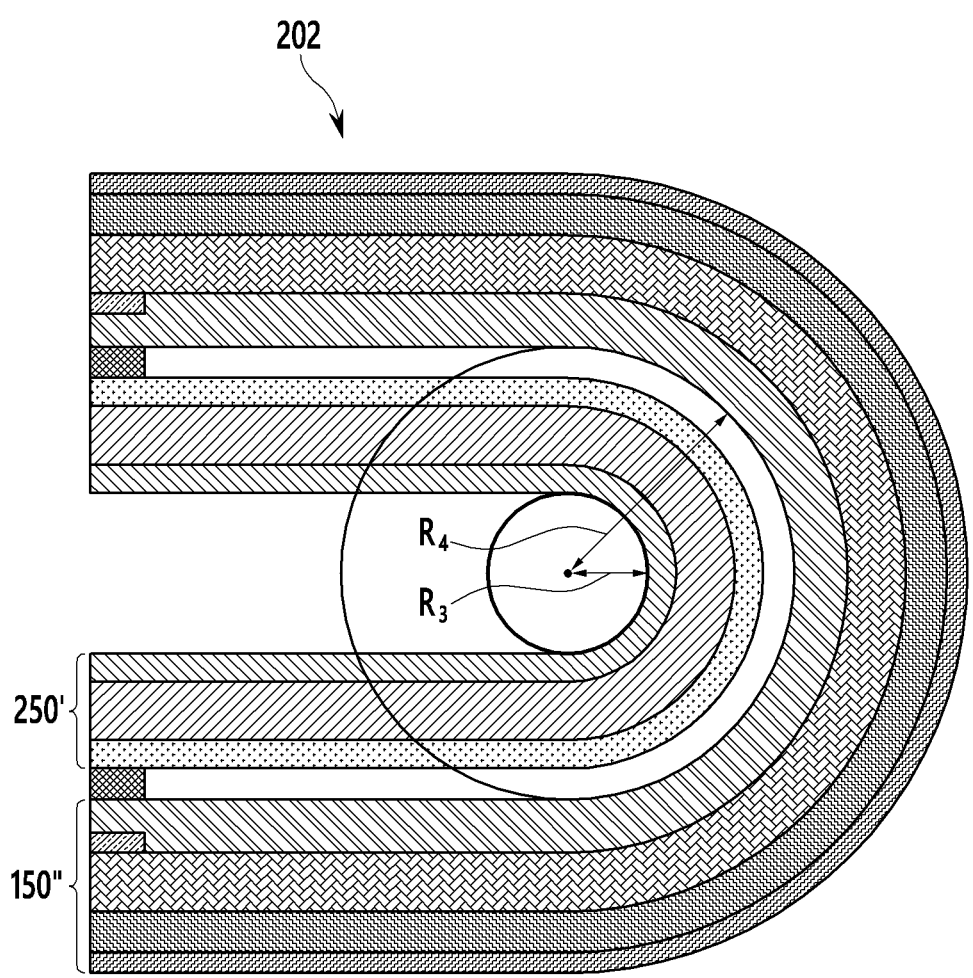
FIG. 6 is a schematic cross-sectional view of the cover window of FIG. 5 in a bent state, according to one or more exemplary embodiments.

FIG. 6 is a schematic cross-sectional view of the cover window of FIG. 5 in a bent state, according to one or more exemplary embodiments.

When the cover window 202 of FIG. 5 is applied to the display device 1000 of FIG. 1, then, as shown in FIG. 6, the second window member 250' is disposed at an inner side of the bent display device 1000. In this manner, when the display device 1000 is bent such that the first window member 150 is exposed to an outer side, a radius of curvature $R_3$ of the second window member 250 becomes smaller than a radius of curvature $R_4$ of the first window member 150. That is, as described above, in the cover window 202, the second window member 250' is attached on the display panel 100 and the first window member 150" is attached on the second window member 250'.

Hereinafter, exemplary manufacturing processes to form cover windows will be described in association with various exemplary embodiments. Further, performance of the exemplary cover windows will be compared to performance of a comparative cover window.

Exemplary Embodiment 1

Thin glass having a thickness of 50 µm was used as a first window member.

Next, a composition that includes silsesquioxane was coated to one side of a polyimide film such that an optical compensation layer was formed. Next, a silicon-based resin composition was coated to the other side of the polyimide film to form a hard coating layer, and an anti-fingerprint layer was formed using a silicon-based composition on the hard coating layer such that a second window member was formed. Next, the first window member and the second window member were attached to each other through a first adhesive such that a cover window was formed. As such, when the display device is bent in a manner such that one side of the first window member and a side where an optical compensation layer of the second window member face each other, a radius of curvature of the first window member was set to be smaller than a radius of curvature of the second window member.

The cover window manufactured according to Exemplary Embodiment 1 is the same as cover window 200 of FIG. 2, except that the cover window of Exemplary Embodiment 1 does not include a first light blocking layer and a second light blocking layer.

Exemplary Embodiment 2

A cover window was manufactured using the same method as Exemplary Embodiment 1, except that a self-healing layer was formed by coating a polyurethane-based composition to one side of a thermoplastic urethane-based film, and the self-healing layer was used as a first window member.

The cover window manufactured according to Exemplary Embodiment 2 is the same as the cover window 201 of FIG. 4, except that the cover window of Exemplary Embodiment 2 does not include a first light blocking layer and a second light blocking layer.

Exemplary Embodiment 3

A self-healing layer was formed by coating a polyurethane-based composition to one side of a thermoplastic urethane-based film, and an anti-fingerprint layer was formed using a silicon-based composition on the self-healing layer, and used as a first window member. Next, a composition that includes silsesquioxane was coated to one side of a polyimide film such that an optical compensation layer was formed, and a hard coating layer was formed by coating a silicon-based resin composition to the other side of the polyimide film such that a second window member was manufactured. Next, the first window member and the second window member were attached to each other via a second adhesive such that a cover window was manufactured. As such, when the display device is bent in a manner such that the side other than a side of the first window member, in which the self-healing layer and the anti-fingerprint layer are formed, and a side of the second window member in which the hard coating layer is formed, face each other, a radius of curvature of the first window member was set to be greater than a radius of curvature of the second window member.

The cover window manufactured according to Exemplary Embodiment 3 is the same as the cover window 202 of FIG. 5, except that the cover window of Exemplary Embodiment 3 does not include a first light blocking layer and a second light blocking layer.

Comparative Example 1

Figure 7:
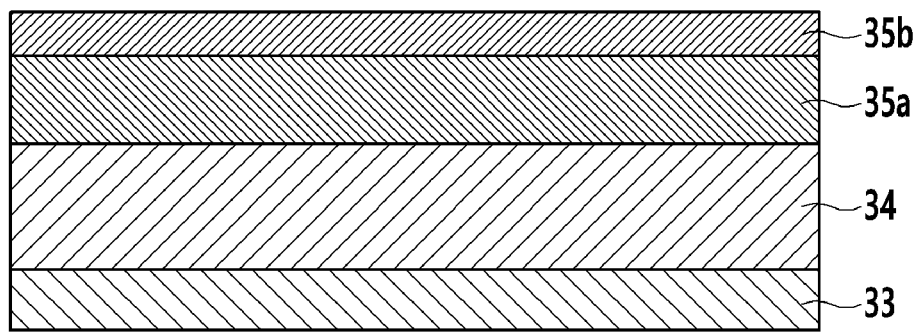
FIG. 7 is a schematic cross-sectional view of a comparative cover window.

FIG. 7 is a schematic cross-sectional view of a comparative cover window.

A cover window that has the same structure as that shown in FIG. 7 was manufactured. That is, a composition that includes silsesquioxane was coated to one side of a polyimide film 34 such that an optical compensation layer 33 was formed. Next, a hard coating layer 35a was formed by coating a silicon-based resin composition to the other side of the polyimide film 34 and an anti-fingerprint layer 35b was formed by coating a silicon-based composition to the other side of the polyimide film 34. In this manner, a comparative cover window was manufactured.

Experimental Example 1: Bending Stiffness Measurement

Figure 8A:
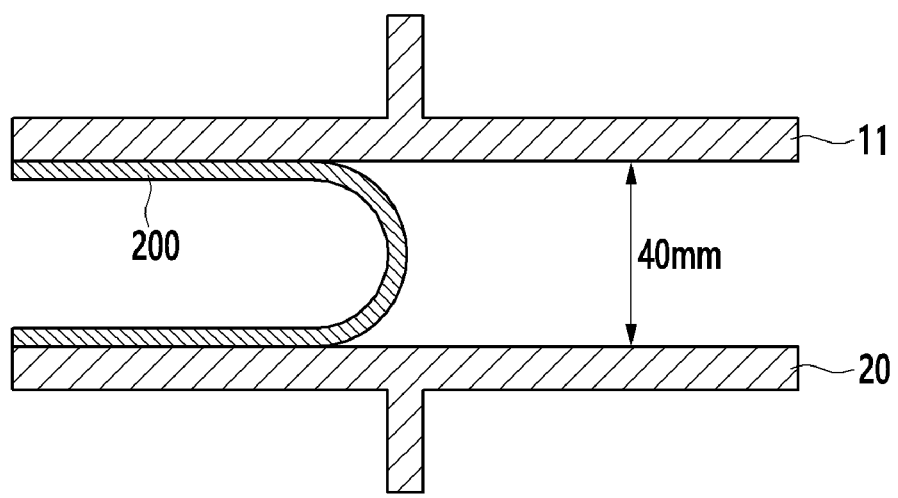
FIGS. 8A and 8B are schematic cross-sectional views to demonstrate bending stiffness of a cover window, according to one or more exemplary embodiments.
Figure 8B:
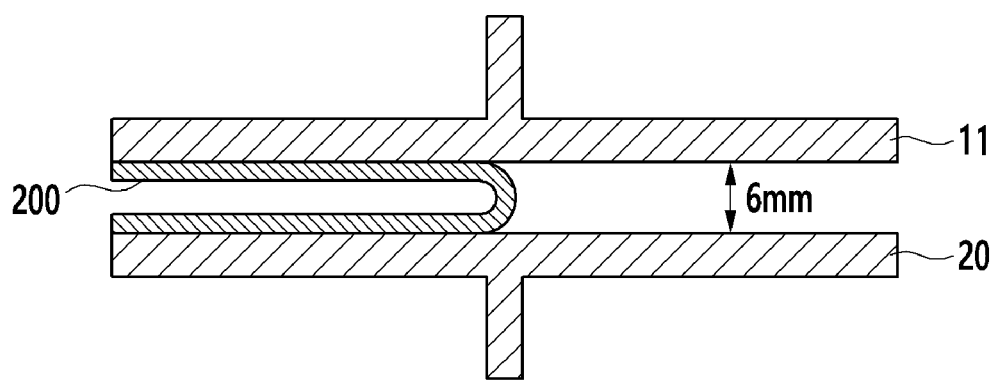

FIGS. 8A and 8B are schematic cross-sectional views to demonstrate measuring the bending stiffness of a cover window, according to one or more exemplary embodiments.

An upper jig 11 was provided on a lower jig 20 with a gap of about 40 mm, and the cover windows according to Exemplary Embodiments 1 to 3 and Comparative Example 1 were respectively fixed to the upper jig 11 and the lower jig 20, as shown in FIG. 8A. Next, a strength N required to reduce the gap between the upper jig 11 and the lower jig 20 to 6 mm as shown in FIG. 8B was measured. Results are provided below in Table 1:

TABLE 1

| Samples | Bending Stiffness (N · cm) |
| --- | --- |
| Exemplary Embodiment 1 | 16 |
| Exemplary Embodiment 2 | 6 |
| Exemplary Embodiment 3 | 10 |
| Comparative Example 1 | 30 |

Referring to Table 1, the cover windows according to Exemplary Embodiments 1 to 3, which include exemplary first window members and exemplary second window members, demonstrate excellent (e.g., better) bending stiffness as compared to the cover window according to Comparative Example 1, which includes only a single window member. In particular, the cover window of Exemplary Embodiment 2, manufactured by forming the impact absorption layer by forming the self-healing layer on one side of the thermoplastic poly urethane-based film and setting the curvature radius of the first window member smaller than that of the second window member, has the best bending stiffness.

Exemplary Embodiments 4 to 6 and Comparative Example 2

Respective display devices according to Exemplary Embodiments 4 to 6 and Comparative Example 2 were respectively manufactured by placing a corresponding display panel that includes an organic light emitting element on a steel sheet and attaching a cover windows according to one of Exemplary Embodiments 1 to 3 and Comparative Example 1 to the corresponding display panel.

Experimental Example 2: Pen-Drop Test

A pen (BIC®) having a weight of 5.8 g was dropped onto the display devices according to Exemplary Embodiments 4 to 6 and Comparative Example 2. A minimum height (cm) at which a bright spot starts to be seen in the respective display devices was measured, and the measurement results are provided below in Table 2. As the values increase, impact resistance increases.

Experimental Example 3: Ball-Drop Test

A ball having a weight of 5.5 g was dropped onto the display devices according to Exemplary Embodiments 4 to 6 and Comparative Example 2. A minimum height (cm) at which a bright spot starts to be seen in the respective display devices was measured, and the measurement results are provided below in Table 2. As the values increase, impact resistance increases.

TABLE 2

| Sample | Pen-drop (cm) | Ball-drop (cm) |
| --- | --- | --- |
| Exemplary Embodiment 4 | 10 | 10 |
| Exemplary Embodiment 5 | 9 | 10 |

TABLE 2-continued

| Sample | Pen-drop (cm) | Ball-drop (cm) |
|---|---|---|
| Exemplary Embodiment 6 | 5 | 10 |
| Comparative Example 2 | 1 | 1 |

Referring to Table 2, the pen-drop and ball-drop test results demonstrate that the display devices of Exemplary Embodiments 4 to 6 to which the cover windows of Exemplary Embodiments 1 to 3 are applied have 5 to 10 times the impact resistance as compared to the display device of Comparative Example 2 to which the cover window of Comparative Example 1 was applied.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
   a display panel; and
   a cover window disposed on the display panel,
   wherein the cover window comprises:
      a first window member disposed on the display panel, the first window member comprising an impact absorption layer; and
      a second window member disposed on the first window member, the first window member being disposed between the display panel and the second window member, and
   wherein the second window member comprises:
      an optical compensation layer;
      a film layer disposed on the optical compensation layer; and
      a coating portion disposed on the film layer.

2. The display device of claim 1, further comprising:
   a first light blocking layer disposed between the first window member and the second window member, the first light blocking layer being further disposed in association with at least one edge of the first window member and the second window member.

3. The display device of claim 2, wherein a thickness of the first light blocking layer is greater than or equal to 5 μm and less than or equal to 40 μm.

4. The display device of claim 1, further comprising:
   a second light blocking layer disposed between the optical compensation layer and the first window member.

5. The display device of claim 1, wherein:
   the impact absorption layer is formed of thin glass; and
   a Young's modulus of the impact absorption layer is greater than or equal to 40 GPa and less than or equal to 60 GPa.

6. The display device of claim 5, wherein a thickness of the impact absorption layer is greater than or equal to 50 μm and less than or equal to 100 μm.

7. The display device of claim 1, wherein the impact absorption layer comprises:
   an impact absorption layer formed of a thermoplastic resin, a Young's modulus of the impact absorption layer being greater than or equal to 10 MPa and less than or equal to 200 MPa; and
   an impact absorption coating layer disposed on the impact absorption layer, a Young's modulus of the impact absorption coating layer being greater than or equal to 20 MPa and less than or equal to 80 MPa.

8. The display device of claim 7, wherein a thickness of the impact absorption layer is greater than or equal to 100 μm and less than or equal to 400 μm.

9. The display device of claim 1, wherein the coating portion comprises:
   a first functional coating layer, a hardness of the first functional coating layer being greater than or equal to 3 H and less than or equal to 6 H; and
   a second functional coating layer disposed on the first functional coating layer.

10. The display device of claim 9, wherein the first functional coating layer comprises at least one of an acryl-based resin, a silicon-based resin, and nanoparticles.

11. The display device of claim 9, wherein the second functional coating layer comprises at least one of a fluorinated-based resin and a silicon-based resin.

12. The display device of claim 1, wherein the optical compensation layer comprises silsesquioxane.

13. The display device of claim 1, wherein the film layer comprises at least one of polyethylene naphthalate (PEN), polymethyl methacrylate (PMMA), polyurethane (PU), polyethylene terephthalate (PET), polyimide (PI), and polycarbonate (PC).

14. A display device comprising:
   a display panel; and
   a cover window disposed on the display panel,
   wherein the cover window comprises:
      a second window member disposed on the display panel; and
      a first window member disposed on the second window member, the second window member being disposed between the first window member and the display panel,
   wherein the first window member comprises an impact absorption layer, and
   wherein the second window member comprises:
      an optical compensation layer;
      a film layer disposed on the optical compensation layer; and
      a third functional coating layer disposed on the film layer.

15. The display device of claim 14, further comprising:
   a first light blocking layer disposed between the first window member and the second window member, the first light blocking layer being further disposed in association with at least one edge of the first window member and the second window member.

16. The display device of claim 14, wherein a thickness of the first light blocking layer is greater than or equal to 5 μm and less than or equal to 40 μm.

17. The display device of claim 14, further comprising:
   a second light blocking layer disposed between the impact absorption layer and the second window member.

18. The display device of claim 14, wherein a hardness of the third functional coating layer is greater than or equal to 3 H and less than or equal to 6 H.

19. The display device of claim 14, wherein the third functional coating layer comprises at least one of an acryl-based resin, a silicon-based resin, and nanoparticles.

20. The display device of claim 14, further comprising:
   a fourth functional coating layer disposed on the impact absorption layer.

21. The display device of claim 20, wherein the fourth functional coating layer comprises at least one of a fluorinated-based resin and a silicon-based resin.

22. The display device of claim 14, wherein the impact absorption layer comprises:
- an impact absorption layer formed of a thermoplastic resin, a Young's modulus of the impact absorption layer being greater than or equal to 10 MPa and less than or equal to 200 MPa; and
- an impact absorption coating layer disposed on the impact absorption layer, a Young's modulus of the impact absorption coating layer being greater than or equal to 20 MPa and less than or equal to 80 MPa.

23. The display device of claim 14, wherein the optical compensation layer comprises silsesquioxane.

24. The display device of claim 14, wherein the film layer comprises at least one of polyethylene naphthalate (PEN), polymethyl methacrylate (PMMA), polyurethane (PU), polyethylene terephthalate (PET), polyimide (PI), and polycarbonate (PC).

* * * * *